United States Patent
Kim et al.

(10) Patent No.: US 12,421,620 B2
(45) Date of Patent: Sep. 23, 2025

(54) STRUCTURES WITH BORON- AND GALLIUM-DOPED SILICON GERMANIUM LAYERS AND METHODS AND SYSTEMS FOR FORMING SAME

(71) Applicant: ASM IP Holding, B.V., Almere (NL)

(72) Inventors: Wonjong Kim, Leuven (BE); Rami Khazaka, Leuven (BE); Michael Givens, Oud-Heverlee (BE); Charles Dezelah, Helsinki (FI)

(73) Assignee: ASM IP Holding B.V., Almere (NL)

( * ) Notice: Subject to any disclaimer, the term of this patent is extended or adjusted under 35 U.S.C. 154(b) by 211 days.

(21) Appl. No.: 18/307,447

(22) Filed: Apr. 26, 2023

(65) Prior Publication Data
US 2023/0349069 A1    Nov. 2, 2023

Related U.S. Application Data

(60) Provisional application No. 63/335,768, filed on Apr. 28, 2022.

(51) Int. Cl.
| | |
|---|---|
| *C30B 29/52* | (2006.01) |
| *C30B 25/16* | (2006.01) |
| *C30B 31/08* | (2006.01) |
| *C30B 31/18* | (2006.01) |
| *C30B 33/08* | (2006.01) |

(52) U.S. Cl.
CPC ............ *C30B 25/165* (2013.01); *C30B 29/52* (2013.01); *C30B 31/08* (2013.01); *C30B 31/18* (2013.01); *C30B 33/08* (2013.01)

(58) Field of Classification Search
CPC ....... C30B 25/165; C30B 31/08; C30B 31/18; C30B 33/08; C30B 29/52
See application file for complete search history.

(56) References Cited

U.S. PATENT DOCUMENTS

| | | | |
|---|---|---|---|
| 11,031,242 B2 * | 6/2021 | Kohen | .............. C23C 16/45553 |
| 11,594,600 B2 * | 2/2023 | Barbosa Lima | .. H01L 21/67063 |
| 2007/0154637 A1 * | 7/2007 | Shenai-Khatkhate | ...................... C30B 25/02 427/248.1 |
| 2021/0066079 A1 * | 3/2021 | Barbosa Lima | .. H01L 21/02532 |
| 2021/0134959 A1 | 5/2021 | Barbosa Lima | |
| 2021/0175069 A1 | 6/2021 | Hikavyy | |

OTHER PUBLICATIONS

Pugh et al, "Gallium Hydride Complexes Stabilised by Multidentate Alkoxide Ligands: Precursors to Thin Films of Ga2O3 at Low Temperatures" Chemistry Eouropean journal, vol. 18 pp. 6079-6087, 2012.*

* cited by examiner

*Primary Examiner* — Robert M Kunemund
(74) *Attorney, Agent, or Firm* — Banner & Witcoff, Ltd.

(57) ABSTRACT

Some examples herein provide a method of forming a doped silicon germanium layer. The method may include simultaneously exposing a substrate to (a) a silicon precursor, (b), a germanium precursor, (c) a boron precursor, and (d) a heteroleptic gallium precursor. The heteroleptic gallium precursor may include (i) at least one straight chain alkyl group in which a terminal carbon is directly bonded to gallium, and (ii) at least one tertiary alkyl group in which a tertiary carbon is directly bonded to gallium. The method may include reacting the silicon precursor, the germanium precursor, the boron precursor, and the heteroleptic gallium precursor to form a silicon germanium layer on the substrate that is doped with boron and gallium.

20 Claims, 6 Drawing Sheets

STRUCTURES WITH BORON- AND GALLIUM-DOPED SILICON GERMANIUM LAYERS AND METHODS AND SYSTEMS FOR FORMING SAME

FIELD OF INVENTION

The present disclosure generally relates to methods and systems suitable for forming electronic device structures. More particularly, the disclosure relates to methods and systems that can be used to form structures including doped semiconductor layers.

BACKGROUND OF THE DISCLOSURE

The scaling of semiconductor devices, such as, for example, complementary metal-oxide-semiconductor (CMOS) devices, has led to significant improvements in speed and density of integrated circuits. However, conventional device scaling techniques face significant challenges for future technology nodes.

One approach to improve semiconductor device performance is to enhance the carrier mobility, and consequently the transistor drive current, utilizing strain induced effects. For example, it has been shown that the hole mobility may be considerably enhanced in p-channel Group IV semiconductor transistors employing stressor regions, such as stressor regions employed in the source and drain regions of the transistors.

Further, reduction in contact resistance to the active regions of a semiconductor device structure may be desirable for ongoing device improvement at future technology nodes. For example, for CMOS device structures, a contact resistance may include the electrical resistance between a contact structure and one or more active (e.g., stressor) regions, such as source and drain regions of the transistor structure. In the case of an n-type MOS device, the stressor region may comprise a highly doped region, i.e., with a carrier density of approximately $5 \times 10^{20}$ cm$^{-3}$ or more, doped with either phosphorus or arsenic. The high doping levels that may be achieved in the n-type MOS device stressor region may result in a contact resistivity below 0.3 mΩ-cm. However, for a p-type MOS device, boron is typically used as a dopant. In some cases, boron may have relatively low solubility in the semiconductor material, and thus high concentrations of the p-type dopant and thus low contact resistance to the semiconductor material can be difficult to obtain.

By way of examples, attempts to lower the contact resistance of silicon germanium films include growing SiGe layers with high boron concentrations. However, high boron concentrations are difficult to achieve with higher Ge:Si ratios due to the low boron solubility in germanium, and therefore, attempts to simply increase the boron concentration in the silicon germanium film have generally not been sufficient to decrease the contact resistivity of the silicon germanium layers to desired values.

Further attempts to decrease the contact resistance to the silicon germanium and similar films include the addition of another dopant, in which the first dopant (e.g., boron) may be soluble, and a high-temperature anneal process. Such techniques may be problematic because the use of the relatively high temperatures during the anneal process can lead to clustering of one or more of the dopants at a surface of the doped semiconductor films.

Furthermore, in some applications, it may be desirable to selectively deposit semiconductor material (e.g., highly-doped Group IV semiconductor material) with a first dopant (e.g., boron) and a second dopant (e.g., gallium, aluminum or indium). However, such techniques may heretofore not be well developed.

Accordingly, improved methods and systems for depositing doped semiconductor material are desired. Structures and devices formed using the methods and/or systems are also desired.

Any discussion, including discussion of problems and solutions, set forth in this section has been included in this disclosure solely for the purpose of providing a context for the present disclosure. Such discussion should not be taken as an admission that any or all of the information was known at the time the invention was made or otherwise constitutes prior art.

SUMMARY OF THE DISCLOSURE

Various embodiments of the present disclosure relate to methods of forming structures, to structures and devices formed using such methods, and to apparatus for performing the methods and/or for forming the structures and/or devices. While the ways in which various embodiments of the present disclosure address drawbacks of prior methods and systems are discussed in more detail below, in general, various embodiments of the disclosure provide improved methods of forming doped semiconductor layers that exhibit relatively low contact resistance. Additionally or alternatively, the doped semiconductor layers can be formed at relatively low temperatures, without the use of a step of annealing to improve the contact resistance of the doped semiconductor layers. Further, exemplary doped semiconductor layers can be selectively formed overlying a first portion of a substrate surface relative to a second portion of the substrate surface.

Some examples herein provide a method of forming a doped silicon germanium layer. The method may include simultaneously exposing a substrate to (a) a silicon precursor, (b), a germanium precursor, (c) a boron precursor, and (d) a heteroleptic gallium precursor. The heteroleptic gallium precursor may include (i) at least one straight chain alkyl group in which a terminal carbon is directly bonded to gallium, and (ii) at least one tertiary alkyl group in which a tertiary carbon is directly bonded to gallium. The method may include reacting the silicon precursor, the germanium precursor, the boron precursor, and the heteroleptic gallium precursor to form a silicon germanium layer on the substrate that is doped with boron and gallium.

In some examples, the method further includes using a first gallium precursor and a second gallium precursor to generate the heteroleptic gallium precursor. The first gallium precursor may include a plurality of the straight chain alkyl groups, and the second gallium precursor may include a plurality of the tertiary alkyl groups. In some examples, generating the heteroleptic gallium precursor includes moving at least one straight chain alkyl group from the first gallium precursor to the second gallium precursor. In some examples, generating the heteroleptic gallium precursor includes moving at least one tertiary alkyl group from the second gallium precursor to the first gallium precursor. In some examples, the heteroleptic gallium precursor is generated in a gas above the substrate.

In some examples, the method includes flowing the first gallium precursor and the second gallium precursor over the substrate in a stoichiometric ratio of about 1:10 to about 10:1. In some examples, the method includes flowing the first gallium precursor and the second gallium precursor over the substrate in a stoichiometric ratio of about 1:3 to about 3:1. In some examples, the method includes flowing the first gallium precursor and the second gallium precursor over the substrate at respective rates of about 1 sccm and about 1000 sccm.

In some examples, the heteroleptic gallium precursor includes at least one of $GaR^1{}_2R^2$ and $GaR^1R^2{}_2$, wherein $R^1$ is the straight chain alkyl group and wherein $R^2$ is the tertiary alkyl group. In some examples, the heteroleptic gallium precursor includes a mixture of $GaR^1{}_2R^2$ and $GaR^1R^2{}_2$. In some examples, the mixture includes $GaR^1{}_2R^2$ and $GaR^1R^2{}_2$ in a ratio of about 1:10 to about 10:1. In some examples, the mixture includes $GaR^1{}_2R^2$ and $GaR^1R^2{}_2$ in a ratio of about 1:3 to about 3:1.

In some examples, the straight chain alkyl group is ethyl, n-propyl, n-butyl, or n-pentyl. In some examples, the tertiary alkyl group is tert-ethyl, tert-propyl, tert-butyl, or tert-pentyl. In some examples, the straight chain alkyl group is ethyl and the tertiary alkyl group is tert-butyl.

In some examples, the heteroleptic gallium precursor is flowed over the substrate at a rate of about 1 sccm to about 1000 sccm.

In some examples, the boron precursor includes diborane ($B_2H_6$), deuterium-diborane ($B_2D_6$), or one or more borohydrides. In some examples, the boron precursor is flowed over the substrate at a rate of about 1 sccm and 1000 sccm.

In some examples, the silicon precursor includes silane ($SiH_4$), disilane ($Si_2H_6$), trisilane ($Si_3H$), tetrasilane ($Si_4H_{10}$), pentasilane ($Si_5H_{12}$), methylsilane ($CH_3 \cdot SiH_3$), dichlorosilane ($H_2SiCl_2$), or diiodosilane ($H_2SiI_2$).

In some examples, the germanium precursor includes germane ($GeH_4$), digermane ($Ge_2H_6$), trigermane ($Ge_3H_8$), or germylsilane ($GeH_6Si$).

In some examples, the substrate is exposed to the silicon precursor, germanium precursor, boron precursor, and heteroleptic gallium precursor at a pressure of about 5 Torr to about 760 Torr. In some examples, the substrate is exposed to the silicon precursor, germanium precursor, boron precursor, and heteroleptic gallium precursor at a pressure of about 10 Torr to about 80 Torr.

In some examples, the substrate is exposed to the silicon precursor, germanium precursor, boron precursor, and heteroleptic gallium precursor at a temperature of about 150° C. to about 450° C.

In some examples, the silicon germanium layer includes surface segregated gallium, and the method further includes removing the surface segregated gallium. In some examples, the removing includes a wet chemical etch.

In some examples, the silicon germanium layer has a thickness of about 5 nm to about 20 nm. In some examples, the silicon germanium layer has a thickness of about 5 nm to about 15 nm. In some examples, the silicon germanium layer has a thickness of about 8 nm to about 12 nm.

In some examples, the silicon germanium layer has a gallium concentration of at least about $2.3 \times 10^{19}$ atoms/cm$^3$ at a depth of 10 nm. In some examples, the silicon germanium layer has a gallium concentration of at least about $2.3 \times 10^{18}$ atoms/cm$^3$ at a depth of 20 nm. In some examples, the silicon germanium layer has a boron concentration of at least about $5.7 \times 10^{20}$ atoms/cm$^3$ at a depth of 10 nm. In some examples, the silicon germanium layer has a boron concentration of at least about $4.1 \times 10^{20}$ atoms/cm$^3$ at a depth of 20 nm.

Some examples herein provide a system for forming a doped silicon germanium layer. The system may include a reaction chamber configured to hold a substrate. The system may include respective sources of (a) a silicon precursor, (b), a germanium precursor, (c) a boron precursor, and (d) a heteroleptic gallium precursor. The heteroleptic gallium precursor may include (i) at least one straight chain alkyl group in which a terminal carbon is directly bonded to gallium, and (ii) at least one tertiary alkyl group in which a tertiary carbon is directly bonded to gallium. The system may include a controller configured to cause the silicon precursor, the germanium precursor, the boron precursor, and the heteroleptic gallium precursor to flow over the substrate and there react to form a silicon germanium layer on the substrate that is doped with boron and gallium.

Some examples herein provide a method of forming a doped silicon germanium layer. The method may include simultaneously exposing a substrate to (a) a silicon precursor, (b), a germanium precursor, (c) a boron precursor, (d) a first gallium precursor, and (e) a second gallium precursor. The first gallium precursor may be different than the second gallium precursor and may include at least one tertiary alkyl group in which a tertiary carbon is directly bonded to gallium. The method may include reacting the silicon precursor, the germanium precursor, the boron precursor, the first gallium precursor, and a second gallium precursor to form a silicon germanium layer on the substrate that is doped with boron and gallium.

Some examples herein provide a system for forming a doped silicon germanium layer. The system may include a reaction chamber configured to hold a substrate. The system may include respective sources of (a) a silicon precursor, (b), a germanium precursor, (c) a boron precursor, (d) a first gallium precursor, and (e) a second gallium precursor. The first gallium precursor may be different than the second gallium precursor and may include at least one tertiary alkyl group in which a tertiary carbon is directly bonded to gallium. The system may include controller configured to cause the silicon precursor, the germanium precursor, the boron precursor, the first gallium precursor, and the second gallium precursor to flow over the substrate and there react to form a silicon germanium layer on the substrate that is doped with boron and gallium.

These and other embodiments will become readily apparent to those skilled in the art from the following detailed description of certain embodiments having reference to the attached figures. The invention is not being limited to any particular embodiments disclosed.

BRIEF DESCRIPTION OF THE DRAWING FIGURES

A more complete understanding of the embodiments of the present disclosure may be derived by referring to the detailed description and claims when considered in connection with the following illustrative figures.

It will be appreciated that elements in the figures are illustrated for simplicity and clarity and have not necessarily been drawn to scale. For example, the dimensions of some of the elements in the figures may be exaggerated relative to other elements to help improve understanding of illustrated embodiments of the present disclosure.

DETAILED DESCRIPTION OF EXEMPLARY EMBODIMENTS

The description of exemplary embodiments of methods, structures, devices and systems provided below is merely exemplary and is intended for purposes of illustration only; the following description is not intended to limit the scope of the disclosure or the claims. Moreover, recitation of multiple embodiments having stated features is not intended to exclude other embodiments having additional features or other embodiments incorporating different combinations of the stated features. For example, various embodiments are set forth as exemplary embodiments and may be recited in the dependent claims. Unless otherwise noted, the exemplary embodiments or components thereof may be combined or may be applied separate from each other.

As set forth in more detail below, various embodiments of the disclosure provide methods for forming a boron- and gallium-doped silicon germanium layer on a surface of a substrate. Exemplary methods can be used to, for example, form source and/or drain regions of semiconductor devices that exhibit relatively high mobility, relatively low contact resistance, and that maintain the structure and composition of the deposited layers. For example, the active doping concentration at the vicinity of a metal contact boron may be increased using in-situ doping techniques which may provide for growth selectivity, damage reduction, doping profile control, and high activation efficiency. Boron (B) is a typical dopant to reduce contact resistivity for silicon germanium (SiGe) based pMOS applications. However, relatively low solubility of B in SiGe (up to about $2.0E+18$ atoms/cm$^3$) may hinder further reductions of contact resistivity. Gallium (Ga) has a higher solubility in Ge (up to about $5.0E+20$ atoms/cm$^3$) than does B, and thus may provide for further reductions in contact resistivity than may be achieved using B alone. As provided herein, Ga may be co-doped with B in-situ while forming SiGe. In some examples, combinations of different Ga precursors, which include different ligands than one another, may be used to enhance co-doping of Ga and B into SiGe, and as such may reduce the contact resistivity of the resulting layer. In some examples, a Ga precursor that is heteroleptic—that includes different ligands coupled to the same Ga atom—also or alternatively may be used to enhance co-doping of Ga and B into SiGe, and as such may reduce the contact resistivity of the resulting layer. Optionally, the heteroleptic Ga precursor may be generated in-situ using combinations of different Ga precursors, or alternatively may be provided from an existing source of the precursor.

In this disclosure, "gas" can include material that is a gas at normal temperature and pressure (NTP), a vaporized solid and/or a vaporized liquid, and can be constituted by a single gas or a mixture of gases, depending on the context. A gas other than the process gas, i.e., a gas introduced without passing through a gas distribution assembly, a multi-port injection system, other gas distribution device, or the like, can be used for, e.g., sealing the reaction space, and can include a seal gas, such as a rare gas. In some cases, the term "precursor" can refer to a compound that participates in the chemical reaction that produces another compound, and particularly to a compound that constitutes a film matrix or a main skeleton of a film; the term "reactant" can be used interchangeably with the term precursor. The term "inert gas" can refer to a gas that does not take part in a chemical reaction and/or does not become a part of a film matrix to an appreciable extent. Exemplary inert (e.g., carrier) gases include He, Ar, $H_2$, $N_2$, and any combination thereof.

As used herein, the term "substrate" can refer to any underlying material or materials that can be used to form, or upon which, a device, a circuit, or a film can be formed. A substrate can include a bulk material, such as silicon (e.g., single-crystal silicon), other Group IV materials, such as germanium, or other semiconductor materials, such as a Group II-VI or Group Ill-V semiconductor, and can include one or more layers overlying or underlying the bulk material. Further, the substrate can include various features, such as recesses, protrusions, and the like formed within or on at least a portion of a layer of the substrate. As set forth in more detail below, a surface of a substrate can include two or more areas, wherein each of the two or more areas comprise different material and/or material with different crystalline structure.

As used herein, the term "epitaxial layer" can refer to a substantially single crystalline layer upon an underlying substantially single crystalline substrate or layer.

As used herein, the term "chemical vapor deposition" can refer to any process wherein a substrate is exposed to one or more volatile precursors, which react and/or decompose on a substrate surface to produce a desired deposition.

As used herein, the term "silicon germanium" can refer to a semiconductor material comprising silicon and/or germanium and can be represented as $Si_{1-x}Ge_x$ wherein $1 \geq x \geq 0$, or $0.2 \geq x \geq 0.8$, or $0.4 \geq x \geq 0.6$, or materials comprising silicon and germanium having compositions as set forth herein.

As used herein, the term "film" and/or "layer" can refer to any continuous or non-continuous structures and material, such as material deposited by the methods disclosed herein. For example, film and/or layer can include two-dimensional materials, three-dimensional materials, nanoparticles or even partial or full molecular layers or partial or full atomic layers or clusters of atoms and/or molecules. A film or layer may comprise material or a layer with pinholes, which may be at least partially continuous.

As used herein, the term "monocrystalline" may refer to a material that includes a substantial single crystal, i.e., a crystalline material that displays long range ordering. It should, however, be appreciated that a "monocrystalline" material may not be a perfect single crystal but may comprise various defects, stacking faults, atomic substitutions, and the like, as long as the "monocrystalline" material exhibits long range ordering.

As used herein, the term "non-monocrystalline" may refer to a material that does not comprise a substantial single crystal, i.e., a material which displays either short range ordering or no ordering of the crystalline structure. Non-monocrystalline materials may comprise polycrystalline materials which may display short range ordering and amorphous materials which may display substantially no ordering of the crystalline structure.

As used herein, a "structure" can include a substrate as described herein. Structures can include one or more layers overlying the substrate, such as one or more layers formed according to a method as described herein.

Further, in this disclosure, any two numbers of a variable can constitute a workable range of the variable, and any ranges indicated may include or exclude the endpoints. Additionally, any values of variables indicated (regardless of whether they are indicated with "about" or not) may refer to precise values or approximate values and include equivalents, and may refer to average, median, representative, majority, or the like. Further, in this disclosure, the terms "including," "constituted by" and "having" refer independently to "typically or broadly comprising," "comprising," "consisting essentially of," or "consisting of" in some embodiments. In this disclosure, any defined meanings do not necessarily exclude ordinary and customary meanings in some embodiments.

Figure 1A:
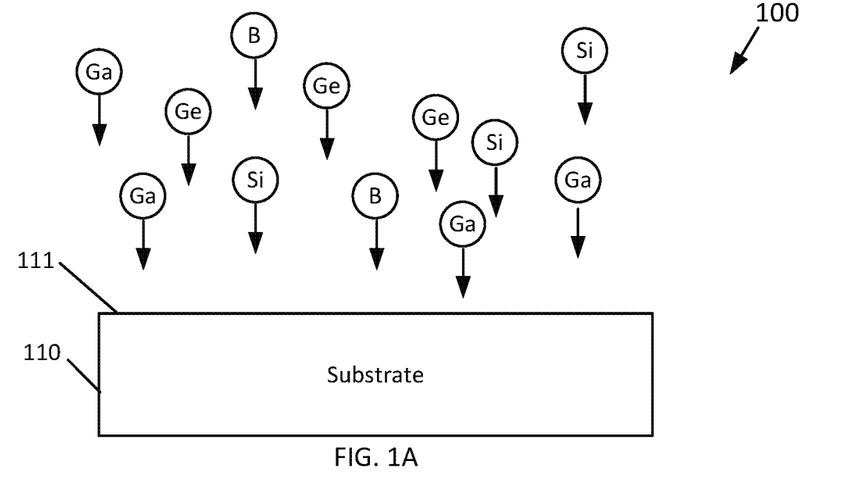
FIGS. 1A-1B schematically illustrate example operations and structures in accordance with exemplary embodiments of the disclosure.
Figure 1B:
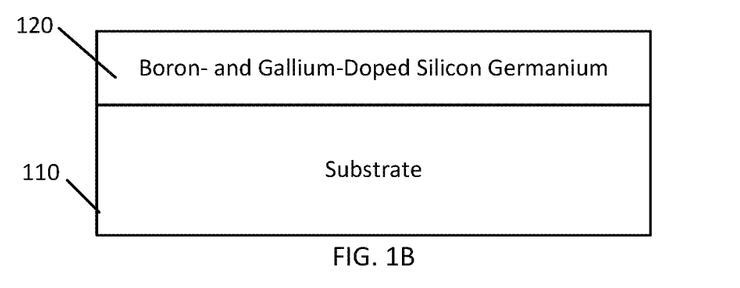

Turning now to the figures, FIGS. 1A-1B schematically illustrate example operations and structures in accordance with exemplary embodiments of the disclosure.

Operation 100 illustrated in FIG. 1A includes simultaneously exposing a substrate to a silicon precursor (labeled Si for simplicity of illustration), a germanium precursor (labeled Ge for simplicity of illustration), a boron precursor (labeled B for simplicity of illustration), and a heteroleptic gallium precursor (labeled Ga for simplicity of illustration). The heteroleptic gallium precursor may include (i) at least one straight chain alkyl group in which a terminal carbon is directly bonded to gallium, and (ii) at least one tertiary alkyl group in which a tertiary carbon is directly bonded to gallium. Nonlimiting examples of such precursors, and suitable reaction conditions, are provided further below. During operation 100, a substrate 110 (e.g., semiconductor wafer) as described herein is provided within a reaction chamber. As a non-limiting example, the reaction chamber used during operation 100 may comprise a reaction chamber of a chemical vapor deposition system. However, it is also contemplated that other reaction chambers and alternative chemical vapor deposition systems may also be utilized to perform the embodiments of the present disclosure. The reaction chamber can be a stand-alone reaction chamber or part of a cluster tool.

Operation 100 can include heating the substrate to a desired deposition temperature within the reaction chamber. In some embodiments of the disclosure, operation 100 includes heating the substrate to a temperature of less than approximately 1100° C., or to a temperature of less than approximately 700° C., or to a temperature of less than approximately 650° C., or to a temperature of less than approximately 600° C., or to a temperature of less than approximately 550° C., or to a temperature of less than approximately 500° C., or to a temperature of less than approximately 450° C., or even to a temperature of less than approximately 400° C., or even to a temperature of less than approximately 300° C., or even to a temperature of less than approximately 250° C. For example, in some embodiments of the disclosure, heating the substrate to a deposition temperature may comprise heating the substrate to a temperature between approximately 400° C. and approximately 1100° C. or approximately 400° C. and approximately 700° C. For example, in some embodiments of the disclosure, heating the substrate to a deposition temperature may comprise heating the substrate to a temperature between approximately 290° C. and 400° C. In other embodiments of the disclosure, heating the substrate to a deposition temperature may comprise heating the substrate to a temperature between approximately 150° C. and 450° C. As such, in one nonlimiting example, the substrate is exposed to the silicon precursor, germanium precursor, boron precursor, and heteroleptic gallium precursor at a temperature of about 150° C. to about 450° C.

In addition to controlling the temperature of the substrate, a pressure within the reaction chamber may also be regulated. For example, in some embodiments of the disclosure, the pressure within the reaction chamber during operation 100 may be less than 760 Torr, or less than 350 Torr, or less than 100 Torr, or less than 50 Torr, or less than 25 Torr, or even less than 10 Torr. In some embodiments, the pressure in the reaction chamber may be between 10 Torr and 760 Torr, between 10 Torr and 200 Torr, or between 10 Torr and 100 Torr. In some examples, the substrate is exposed to the silicon precursor, germanium precursor, boron precursor, and heteroleptic gallium precursor at a pressure of about 5 Torr to about 760 Torr. In some examples, the substrate is exposed to the silicon precursor, germanium precursor, boron precursor, and heteroleptic gallium precursor at a pressure of about 10 Torr to about 80 Torr.

As a result of reactions occurring in-situ during operation 100, B- and Ga-doped SiGe layer 120 is formed overlying the substrate 110, e.g., as shown in FIG. 1B. Layer 120 may form as a (e.g., mono) crystalline material overlying at least a portion of the upper surface 111 of the substrate. Accordingly, at least a portion of layer 120 may be monocrystalline and serve as a template for one or more further epitaxial layers.

During operation 100 illustrated in FIG. 1A, the boron, gallium, silicon, and germanium precursors are flowed into the reaction chamber—e.g., through one or more gas injectors, such as multi-port injectors (MPIs) including a plurality of individual port injectors for providing a gas mixture into the reaction chamber. Various combinations of the precursors can be supplied to one or more of the individual port injectors to fine tune concentration profiles as desired.

Exemplary silicon precursors for deposition of layer 120 may comprise one or more hydrogenated silicon precursors selected from the group comprising: silane ($SiH_4$), disilane ($Si_2H_6$), trisilane ($Si_3H$), tetrasilane ($Si_4H_{10}$), pentasilane ($Si_5H_{12}$), methylsilane ($CH_3 \cdot SiH_3$), dichlorosilane ($H_2SiCl_2$), diiodosilane ($H_2SiI_2$) or other suitable silicon-containing precursor.

Exemplary germanium precursors for deposition of layer 120 may comprise at least one of germane ($GeH_4$), digermane ($Ge_2H_6$), trigermane ($Ge_3H_8$), or germylsilane ($GeH_6Si$), or other suitable germanium-containing precursor.

Exemplary boron precursors for deposition of layer 120 can include, for example, at least one of diborane ($B_2H_6$) or deuterium-diborane ($B_2D_6$), or one or more borohydrides. Exemplary borohydrides include gallium borohydride ($Ga(BH_4)_3$), aluminum borohydride ($Al(BH_4)_3$), and indium borohydride ($In(BH_4)_3$). In alternative embodiments of the disclosure, the boron precursor may comprise a borohydride having the formula $Y_xM(BH_4)_{3-x}$, wherein Y is independently chosen from hydrogen, deuterium, chlorine, bromine, and iodine; M is a Group IIIA metal independently chosen from gallium, aluminum, and indium; and x is an integer from 0-2.

In some embodiments of the disclosure, the boron precursor includes one or more organic borohydrides having the general formula $R_xM(BH_4)_{3-x}$, wherein R is independently chosen from $CH_3$, $C_2H_5$, $C_6H_5$, $CF_3SO_3$, and $NH_2$; M is a Group IIIA metal independently chosen from gallium, aluminum and indium; and x is an integer from 1-3.

In some embodiments of the disclosure, the heteroleptic gallium precursor can comprise at least one of $GaR^1{}_2R^2$ and $GaR^1R^2_2$, wherein $R^1$ optionally is the straight chain alkyl group and wherein $R^2$ is a tertiary alkyl group. Without wishing to be bound by any theory, it is believed that use of a heteroleptic gallium precursor during operation 100, in combination with the silicon, germanium, and boron precursors, may provide for a sufficient concentration of Ga and B dopants, throughout the thickness of the layer 120 which is formed, as to suitable reduce contact resistivity of the layer 120. In particular, and without wishing to be bound by any theory, it is believed that a gallium precursor including only straight chain alkyl groups, such as triethyl gallium (TEGa), may undergo relatively rapid beta-hydride elimination during in-situ reaction, resulting in a particular distribution of gallium within a boron- and gallium-doped silicon germanium layer formed using such precursor. In comparison, and still without wishing to be bound by any theory, it is believed that a heteroleptic gallium precursor including both a straight chain alkyl and a tertiary alkyl ligand may undergo relatively slower beta-hydride elimination, resulting in improved distribution of gallium within a boron- and gallium-doped silicon germanium layer formed using such precursor, e.g., a higher gallium concentration and a flatter distribution of gallium within the layer. Maximizing Ga dopant level and having a relatively flat Ga dopant profile in the layer may make the layer more robust to wet-chemical etching process which is used prior to metal contact deposition. Nonlimiting examples of elemental compositions, and contact resistivities of layers formed using different precursors and different reaction conditions, are provided further below.

In some examples, the heteroleptic gallium precursor comprises a mixture of $GaR^1_2R^2$ and $GaR^1R^2_2$. Optionally, the mixture may include $GaR^1_2R^2$ and $GaR^1R^2_2$ in a ratio of about 1:10 to about 10:1, illustratively in a ratio of about 1:3 to about 3:1. The straight chain alkyl group ($R^1$) may be or may include, for example, ethyl (—$CH_2CH_3$), n-propyl (—$CH_2CH_2CH_3$), n-butyl (—$CH_2CH_2CH_2CH_3$), or n-pentyl (—$CH_2CH_2CH_2CH_2CH_3$). The tertiary alkyl group ($R^2$) may be or may include tert-ethyl (—$C(CH_2CH_3)_3$), tert-propyl (—$C(CH_2CH_2CH_3)_3$), tert-butyl (—$C(CH_2CH_2CH_2CH_3)_3$), or tert-pentyl (—$C(CH_2CH_2CH_2CH_2CH_3)_3$). In one nonlimiting example, the straight chain alkyl group is ethyl and the tertiary alkyl group is tert-butyl.

Figure 2:
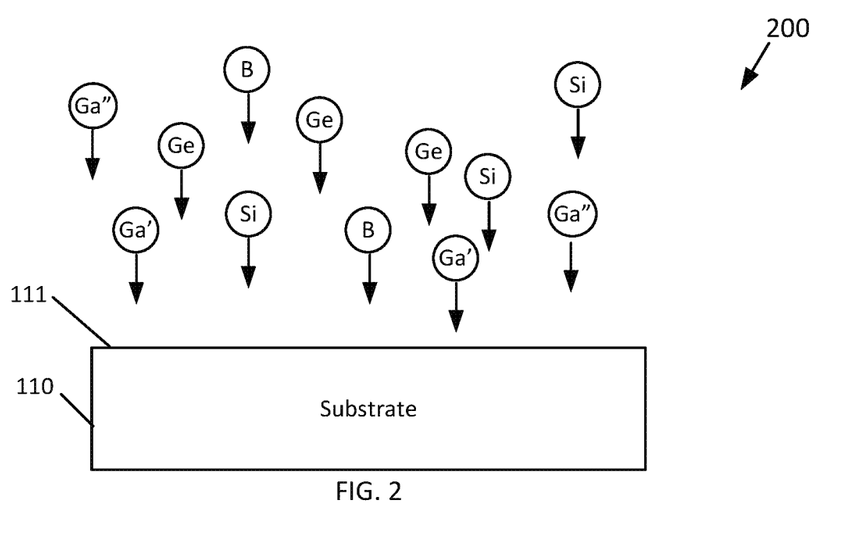
FIG. 2 schematically illustrates another example operation in accordance with exemplary embodiments of the disclosure.

In some examples, the heteroleptic gallium precursor may be formed in-situ during deposition of layer 120. For example, FIG. 2 schematically illustrates another example operation in accordance with exemplary embodiments of the disclosure. More specifically, FIG. 2 illustrates operation 200 which is one example manner in which operation 100 may be implemented. Operation 200 includes using a first gallium precursor (labeled Ga' for simplicity of illustration) and a second gallium precursor (labeled Ga" for simplicity of illustration) to generate the heteroleptic gallium precursor described with reference to FIGS. 1A-1B. In some examples, first gallium precursor Ga' may include a plurality of the straight chain alkyl groups ($R^1$), and second gallium precursor Ga" may include a plurality of the tertiary alkyl groups ($R^2$). Generating the heteroleptic gallium precursor may include moving at least one straight chain alkyl group ($R^1$) from the first gallium precursor Ga' to the second gallium precursor Ga". Additionally, or alternatively, generating the heteroleptic gallium precursor may include moving at least one tertiary alkyl group ($R^2$) from the second gallium precursor Ga" to the first gallium precursor Ga'. The heteroleptic gallium precursor may be generated in a gas above the substrate. However, it will be appreciated that the first gallium precursor Ga' and second gallium precursor Ga" need not necessarily exchange ligands in the gas phase, and indeed need not even form a heteroleptic gallium precursor. Instead, the first gallium precursor Ga' and second gallium precursor Ga" suitably may react with any one or more of the other precursors as part of the present in-situ process for forming boron- and gallium-doped silicon germanium materials.

In still other examples, the heteroleptic gallium precursor may be obtained in a pre-formed state and may be flowed over the substrate at any suitable rate. Illustratively, the heteroleptic gallium precursor may be generated by providing vapors of a first gallium precursor Ga' and a second gallium precursor Ga" (e.g., TEGa and TTBGa) to a reaction chamber at a suitable temperature and pressure (illustratively, $T_c$: 450° C., Pressure=20 Torr). The flow rates of the first and second gallium precursors and any carrier gas suitably may be selected to generate a heteroleptic gallium precursor having the desired stoichiometric mixture of ligands (illustratively, $N_2$ carrier gas flow=10 slm, TEGa flow=10 sccm, TTBGa flow=350 sccm). In some examples, the reactants may be continually provided to the reaction chamber, and a product stream continually removed from the reaction chamber. The reaction stream may include a mixture of the first and second gallium precursors and the heteroleptic gallium precursor (illustratively, a mixture of TEGa, TTGBa, and a heteroleptic gallium alkyl precursor). The product stream is then cooled, e.g. with a heat exchanger, to form a cooled reaction stream. The cooled reaction stream then may be sent to a separation stage, e.g. fractional distillation, either at atmospheric or at reduced pressure, to obtain one or more heteroleptic gallium precursor product streams.

In nonlimiting examples in which the first gallium precursor Ga' and second gallium precursor Ga" are used (and independently of whether such precursors exchange ligands or not), such precursors may be flowed at any suitable rate and in any suitable stoichiometric ratio relative to one another and relative to the B, Si, and Ge precursors. Illustratively, operation 200 may include flowing the first gallium precursor Ga' and the second gallium precursor Ga" over the substrate in a stoichiometric ratio of about 1:10 to about 10:1, for example in a stoichiometric ratio of about 1:3 to about 3:1. Additionally, or alternatively, operation 200 may include flowing the first gallium precursor Ga' and the second gallium precursor Ga" over the substrate at respective rates of about 1 sccm and about 1000 sccm. Additionally, or alternatively, the heteroleptic gallium precursor may be flowed over the substrate at a rate of about 1 sccm to about 1000 sccm.

A thickness of the boron- and gallium-doped silicon germanium layer 120 formed during operation 100 or operation 200 can be between about 5 nm and about 20 nm, between about 5 nm and about 15 nm, or between about 8 nm and about 12 nm. Optionally, the layer can be formed with a thickness greater than the above ranges, and a portion of the layer subsequently removed to provide a thickness within any suitable one of the above ranges. For example, in a manner such as will be described below, the boron- and gallium-doped silicon germanium layer 120 may include surface segregated gallium, and the surface segregated gallium optionally may be removed, e.g., using a wet chemical etch.

The concentrations of boron, gallium, silicon, and germanium within layer 120 (with or without optional removal of surface segregated gallium) suitably may be selected and controlled in a manner such as described elsewhere herein.

Physically, the doping profile within layer 120 may be selected and controlled so as to be sufficiently deep that the entire space charge region at the metal-semiconductor contact is contained within the layer 120. Reducing the thickness of layer 120 may facilitate formation of the film with sufficiently high epitaxial quality, and a sufficiently low level of leakage current, for stable use at a metal-semiconductor contact. In some examples, the gallium profile preferably is highest at the surface of layer 120. A flat gallium profile also suitably may be used. In nonlimiting examples, layer 120 has a gallium concentration of at least about $2.3 \times 10^{19}$ atoms/cm$^3$ at a depth of 10 nm. Additionally, or alternatively, in nonlimiting examples, layer 120 has a gallium concentration of at least about $2.3 \times 10^{18}$ atoms/cm$^3$ at a depth of 20 nm. Additionally, or alternatively, in nonlimiting examples, layer 120 has a boron concentration of at least about $5.7 \times 10^{20}$ atoms/cm$^3$ at a depth of 10 nm. Additionally, or alternatively, in nonlimiting examples, layer 120 has a boron concentration of at least about $4.1 \times 10^{20}$ atoms/cm$^3$ at a depth of 20 nm. Such values may correspond to values following an etch step such as described elsewhere herein, or may correspond to values without need for, or use of, such an etch step.

Layer 120 also can include about 10% to about 90%, or about 30% to about 70%, or about 40% to about 50% silicon and/or about 10% to about 90%, or about 65% to about 30%, or about 60% to about 50% germanium. In some embodiments, the germanium (and/or other component) content within layer 120 may not be constant, but rather may be varied, such that the germanium content (and/or other component) may have a graded composition within layer 120.

Figure 3A:
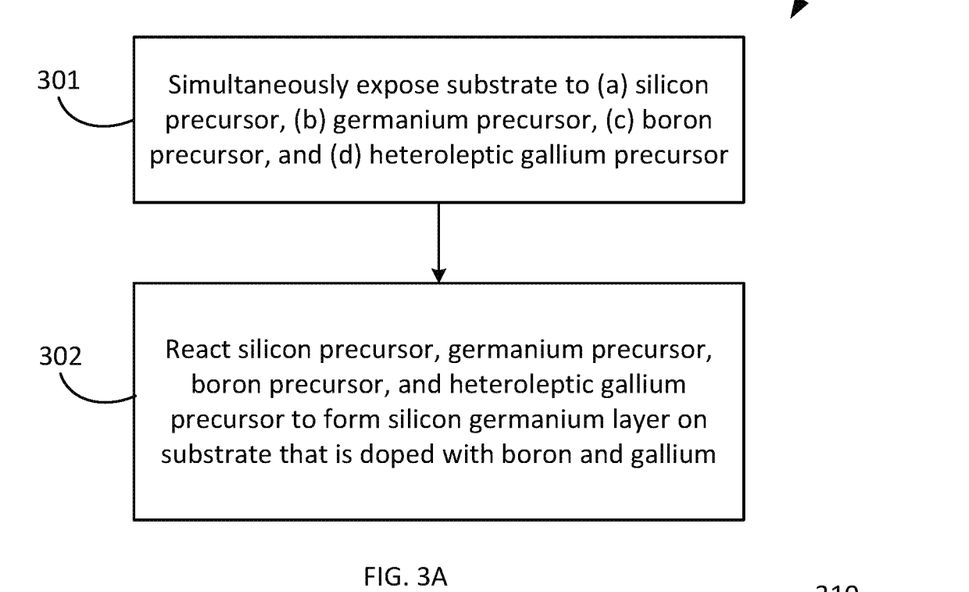
FIGS. 3A-3B illustrate example flows of operations in example methods in accordance with exemplary embodiments of the disclosure.
Figure 3B:
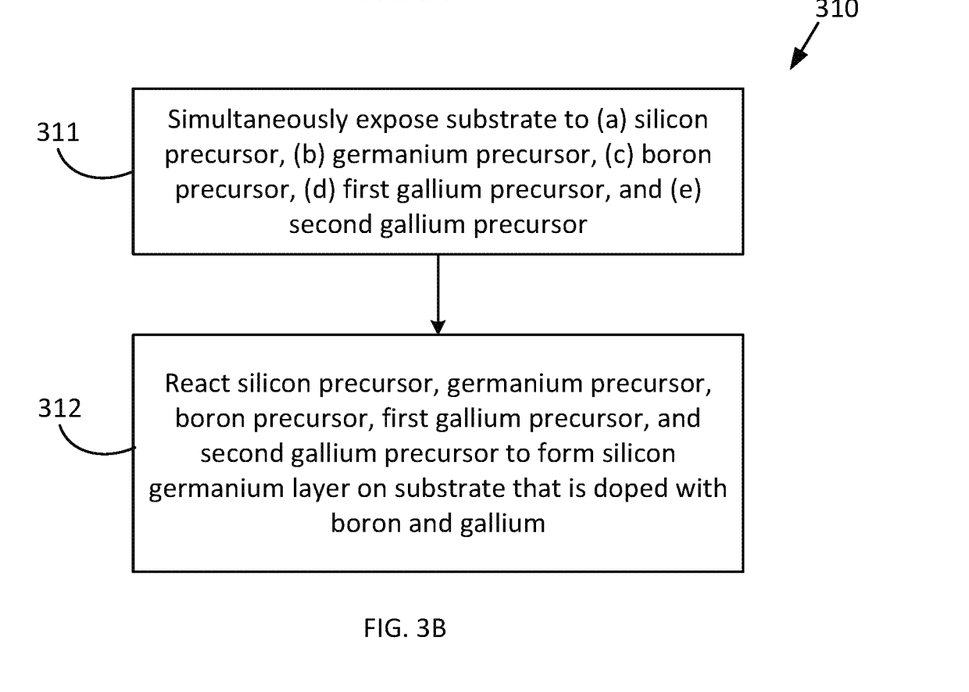

FIGS. 3A-3B illustrate example flows of operations in example methods in accordance with exemplary embodiments of the disclosure. Method 300 illustrated in FIG. 3A includes an operation for simultaneously exposing a substrate to (a) a silicon precursor, (b) a germanium precursor, (c) a boron precursor, and (d) a heteroleptic gallium precursor (operation 301). The heteroleptic gallium precursor may include (i) at least one straight chain alkyl group in which a terminal carbon is directly bonded to gallium, and (ii) at least one tertiary alkyl group in which a tertiary carbon is directly bonded to gallium. For example, in a manner such as illustrated in FIG. 1A, substrate 110 may be placed in a reaction chamber and its upper surface 111 exposed to the mixture of precursors including the heteroleptic gallium precursor (represented in FIG. 1A as Ga for simplicity of illustration). In a manner such as described with reference to FIG. 2, and without wishing to be bound by any theory, in some examples the heteroleptic gallium precursor optionally may be formed using a mixture of a first gallium precursor Ga' and second gallium precursor Ga". Other options for the different precursors, flow rates, stoichiometries, and reaction conditions are described elsewhere herein. Method 300 illustrated in FIG. 3A also includes reacting the silicon precursor, germanium precursor, boron precursor, and heteroleptic gallium precursor to form a silicon germanium layer that is doped with boron and gallium (operation 302). For example, layer 120 may be formed on the substrate in a manner such as illustrated in FIG. 1B. Example characteristics of layer 120 are described elsewhere herein, and suitably may be selected via control of the different precursors, flow rates, stoichiometries, and reaction conditions in a manner such as described elsewhere herein.

It will be appreciated that use of a heteroleptic gallium precursor is optional, and indeed represents just one nonlimiting theory of a manner in which the first gallium precursor Ga' and second gallium precursor Ga" may interact with one another while forming a boron- and gallium-doped silicon germanium layer. That is, regardless of any particular chemical mechanism via which various precursors may interact, the first gallium precursor Ga' and second gallium precursor Ga" may be used to form a boron- and gallium-doped silicon germanium layer. Method 310 illustrated in FIG. 3B includes an operation for simultaneously exposing a substrate to (a) a silicon precursor, (b) a germanium precursor, (c) a boron precursor, (d) a first gallium precursor, and a second gallium precursor (operation 311). The second gallium precursor is different than the first gallium precursor and may comprise at least one tertiary alkyl group ($R^2$) in which a tertiary carbon is directly bonded to gallium. Nonlimiting examples of the tertiary alkyl group ($R^2$) include tert-ethyl (—C(CH$_2$CH$_3$)$_3$), tert-propyl (—C(CH$_2$CH$_2$CH$_3$)$_3$), tert-butyl (—C(CH$_2$CH$_2$CH$_2$CH$_3$)$_3$), and tert-pentyl (—C(CH$_2$CH$_2$CH$_2$CH$_2$CH$_3$)$_3$). Optionally, the first gallium precursor may include a straight chain alkyl group ($R^1$) in which a primary carbon is directly bonded to gallium. Nonlimiting examples of the straight chain alkyl group may be or may include, for example, ethyl (—CH$_2$CH$_3$), n-propyl (—CH$_2$CH$_2$CH$_3$), n-butyl (—CH$_2$CH$_2$CH$_2$CH$_3$), or n-pentyl (—CH$_2$CH$_2$CH$_2$CH$_2$CH$_3$). In a manner such as illustrated in FIG. 2, substrate 110 may be placed in a reaction chamber and its upper surface 111 exposed to the mixture of precursors. Options for the different precursors, flow rates, stoichiometries, and reaction conditions are described elsewhere herein. Method 310 illustrated in FIG. 3B also includes reacting the silicon precursor, germanium precursor, boron precursor, first gallium precursor, and second gallium precursor to form a silicon germanium layer that is doped with boron and gallium (operation 302). For example, layer 120 may be formed on the substrate in a manner such as illustrated in FIG. 1B. Example characteristics of layer 120 are described elsewhere herein, and suitably may be selected via control of the different precursors, flow rates, stoichiometries, and reaction conditions in a manner such as described elsewhere herein.

Figure 4:
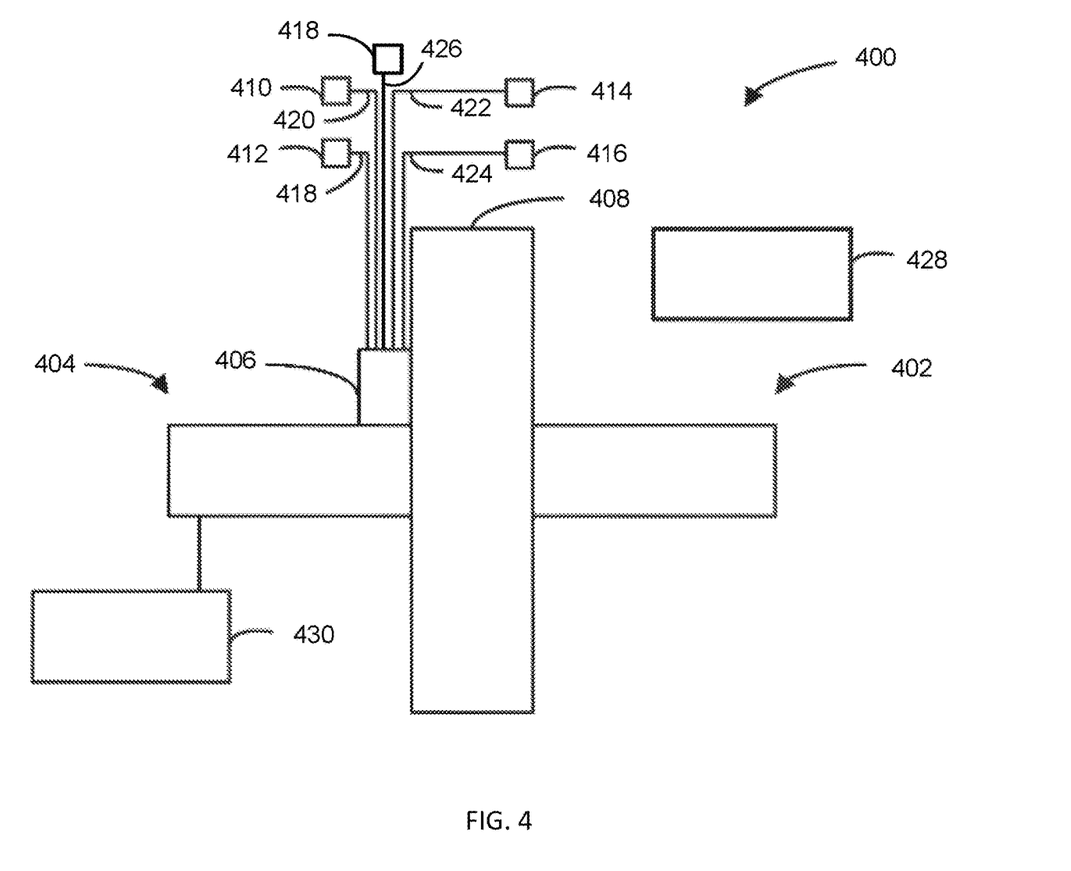
FIG. 4 illustrates a reactor system in accordance with additional exemplary embodiments of the disclosure.

FIG. 4 illustrates a reactor system in accordance with additional exemplary embodiments of the disclosure. System 400 can be used to perform a method as described herein and/or form a structure or device portion as described herein.

In the illustrated example, system 400 includes an optional substrate handling system 402, one or more reaction chambers 404, a gas injection system 406, and optionally a wall 408 disposed between reaction chamber(s) 404 and substrate handling system 402. System 400 can also include a first gas source 410, a second gas source 412, a third gas source 414, a fourth gas source 416, an optional fifth gas source 418, an exhaust source 430, and a controller 428.

Although illustrated with four gas sources 410-416 and an optional fifth gas source 418, system 400 can include any suitable number of gas sources. Gas sources 410-418 can each include, for example, a precursor gas, such as a silicon precursor, germanium precursor, boron precursor, and any suitable gallium precursor(s) (illustratively, a heteroleptic gallium precursor such as described with reference to FIGS. 1A and 3A or first and second gallium precursors such as described with reference to FIGS. 2 and 3B. Gas sources 410-418 may include any suitable mixtures of such precursors and/or mixtures of one or more precursors with a carrier gas, such as hydrogen, nitrogen, argon, helium or the like. Gas sources 410-418 can be coupled to reaction chamber 404 via lines 418-426, which can each include flow controllers, valves, heaters, and the like.

System 400 can include any suitable number of reaction chambers 404 and substrate handling systems 402. Further, one or more reaction chambers 404 can be or include a cross-flow, cold wall epitaxial reaction chamber.

Exhaust source 1226 can include one or more vacuum pumps.

Controller 428 can be configured to perform various functions and/or steps as described herein. For example, controller 428 can be configured to control gas flow into the gas injection system to form a boron- and gallium-doped silicon germanium layer, as described above. Controller 428 can include one or more microprocessors, memory elements, and/or switching elements to perform the various functions. Although illustrated as a single unit, controller 428 can alternatively comprise multiple devices. By way of examples, controller 428 can be used to control gas flow (e.g., by monitoring flow rates of precursors and/or other gases from sources 410-418 and/or controlling valves, motors, heaters, and the like). Further, when system 400 includes two or more reaction chambers, the two or more reaction chambers can be coupled to the same/shared controller.

During operation of reactor system 400, substrates, such as semiconductor wafers (not illustrated), are transferred from, e.g., substrate handling system 402 to reaction chamber 404. Once substrate(s) are transferred to reaction chamber 404, respective gases from gas sources 410-418, such as precursors, dopants, carrier gases, and/or purge gases, are introduced into reaction chamber 404 via gas injection system 406. Gas injection system 406 can be used to meter and control gas flow of gases (e.g., from gas sources 410-418) during substrate processing and to provide desired flows of such gasses to multiple sites within reaction chamber 404.

Figure 5:
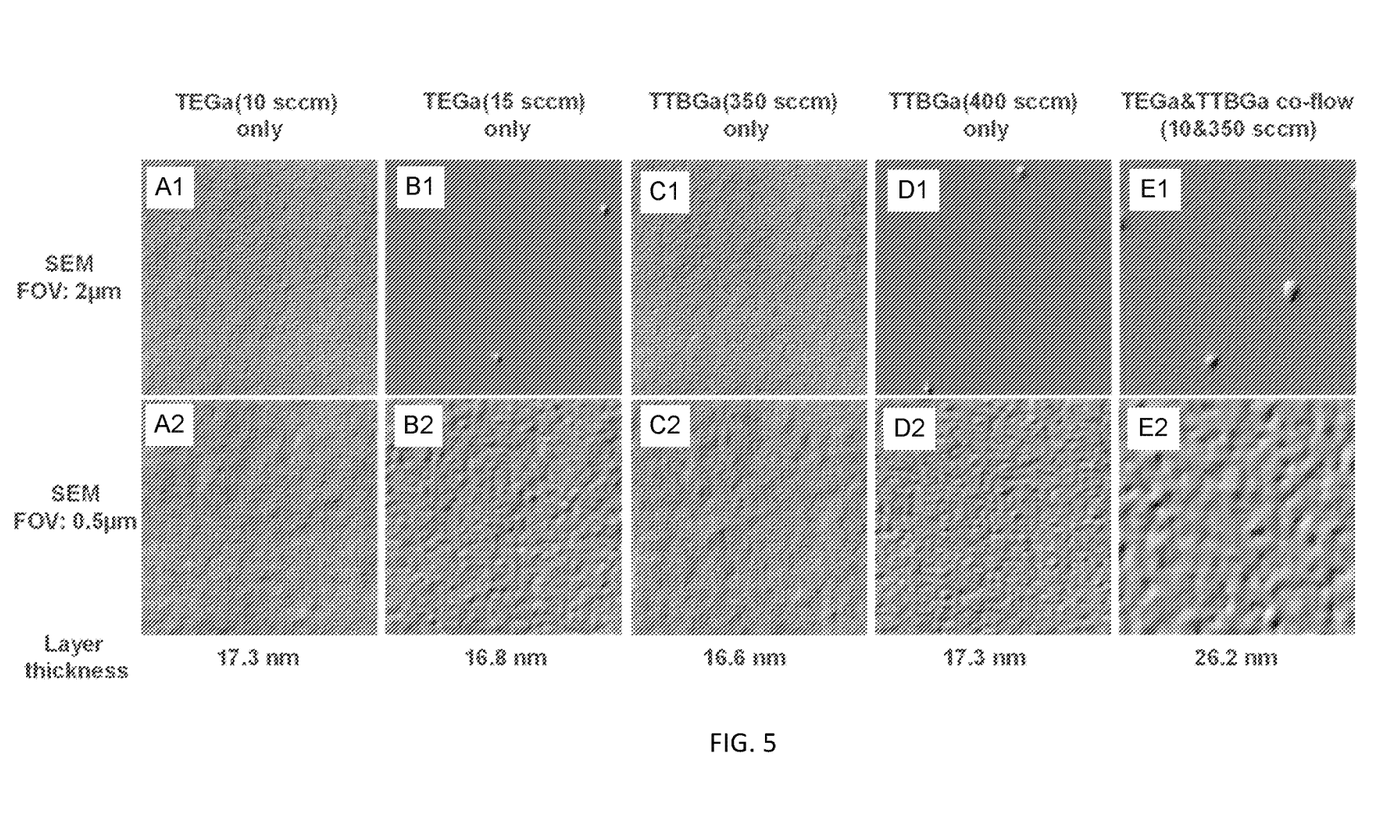
FIG. 5 shows scanning electron microscope (SEM) images of doped silicon germanium layers formed using different combinations of precursors.

FIG. 5 shows scanning electron microscope (SEM) images of doped silicon germanium layers formed using different combinations of precursors. Each of the samples was grown at a temperature of 450° C. and a pressure of 20 Torr, using a nitrogen carrier gas flow of 10 slm, using the silicon precursor $SiH_4$ at a flow rate of 350 sccm, the germanium precursor $GeH_4$ at a flow rate of 1700 sccm, and the boron precursor $B_2H_6$ at a flow rate of 5 sccm. Different gallium precursors and/or different flow rates of gallium precursors were used, and the morphology of the resulting boron- and gallium-doped silicon germanium film analyzed using SEM with a field of view (FOV) of 2 microns (top panels) and a FOV of 0.5 microns (lower panels).

The SEM images shown in panels A1 and A2 are of a layer grown using a flow rate of 10 sccm TEGa as the gallium precursor; the layer thickness was measured to be 17.3 nm. The SEM images shown in panels B1 and B2 are of a layer grown using a flow rate of 15 sccm TEGa as the gallium precursor; the layer thickness was measured to be 16.8 nm. The SEM images shown in panels C1 and C2 are of a layer grown using a flow rate of 350 sccm of tris(tert-butyl) gallium (TTBGa); the layer thickness was measured to be 16.6 nm. The SEM images shown in panels D1 and D2 are of a layer grown using a flow rate of 400 sccm of TTBGa; the layer thickness was measured to be 17.3 nm. The SEM images shown in panels E1 and E2 are of a layer grown using a flow rate of 10 sccm of TEGa and a flow rate of 350 sccm of TTBGa; the layer thickness was measured to be 26.2 nm. It may be seen that as a result of certain gallium single precursor flows (e.g., as in B1 and D1) or gallium precursor co-flow (e.g., as in E1) macroscopic gallium droplets may form on the surface. Such droplets may be removed in a manner such as described elsewhere herein.

Figure 6A:
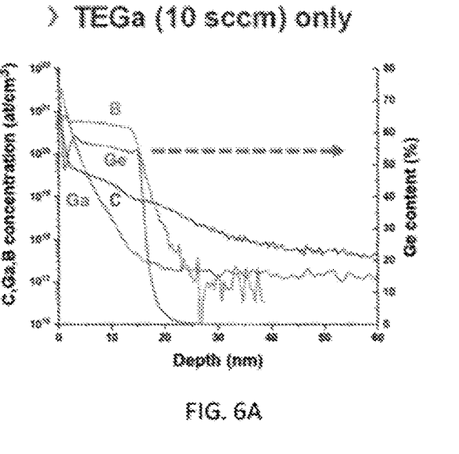
FIGS. 6A-6D show secondary ion mass spectroscopy (SIMS) measurement results for doped silicon germanium layers formed using different combinations of precursors.
Figure 6B:
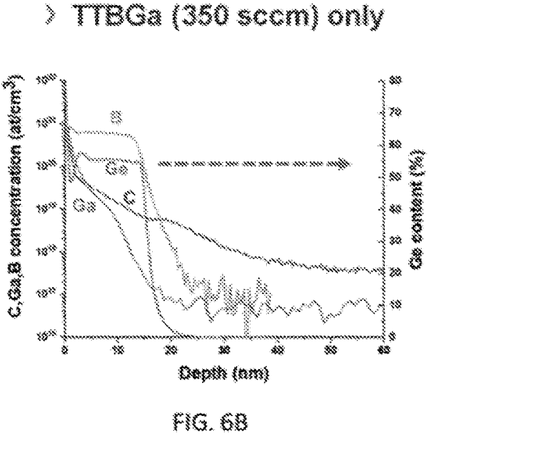
Figure 6C:
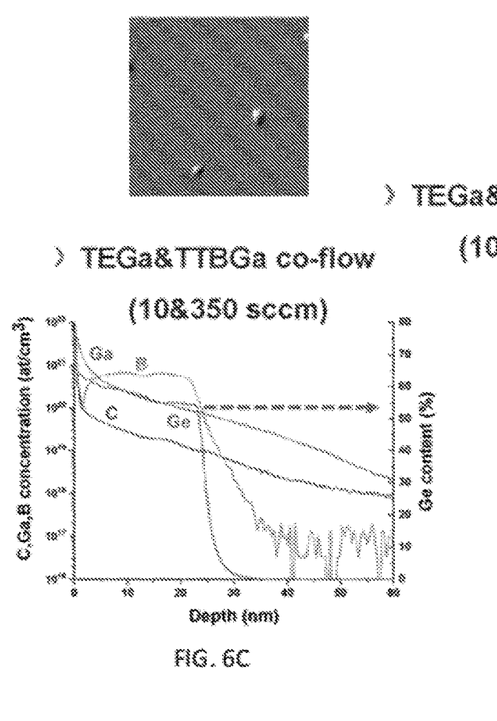
Figure 6D:
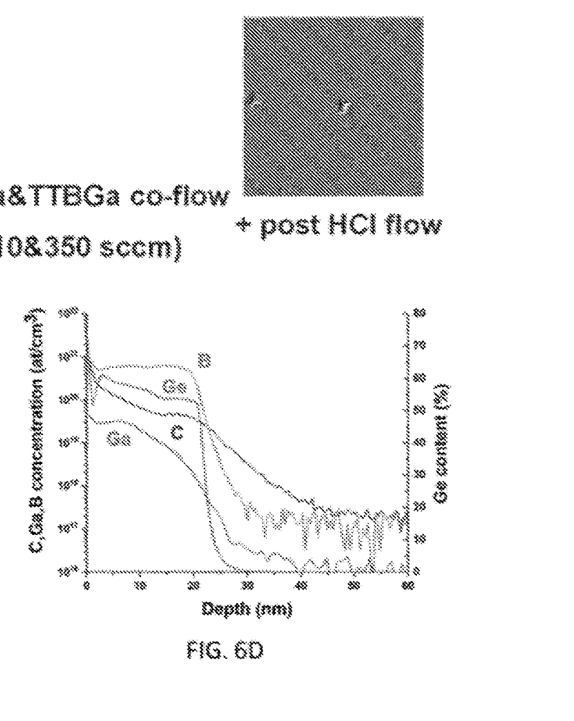

FIGS. 6A-6D show secondary ion mass spectroscopy (SIMS) measurement results for doped silicon germanium layers formed using different combinations of precursors. More specifically, FIG. 6A shows SIMS measurements for the sample shown in panels A1 and A2 of FIG. 5; FIG. 6B shows SIMS measurements for the sample shown in panels C1 and C2 of FIG. 5; FIG. 6C shows SIMS measurements for the sample shown in panels E1 and E2 of FIG. 5, as well as another SEM image of that sample with a 2 micron FOV; and FIG. 6D shows SIMS measurements for the sample shown in panels E1 and E2 of FIG. 5, as well as another SEM image of that sample with a 2 micron FOV, after the sample was wet etched with aqueous HCl of less than 10% by volume HCl to remove surface aggregated gallium. From FIGS. 6A-6D, it may be understood that more gallium may be incorporated into the layer using a gallium precursor co-flow approach (e.g., as in E1) as compared to certain gallium single precursor flows (e.g., as in A1 and C1). Additionally, the gallium profile shown in FIGS. 6A and 6B (corresponding to certain gallium single precursor flows) is more sloped than that shown in FIG. 6D (corresponding to the gallium precursor co-flow followed by etch). As such, it may be understood that the co-flow approach may provide a more uniform distribution of gallium within the layer. Furthermore, the level of gallium doping formed using gallium precursor co-flow followed by etch is (FIG. 6D) is about an order magnitude higher than the level of gallium doping formed using a single gallium precursor (FIGS. 6A-6B) Illustratively, at a depth of 10 nm, the gallium concentration in FIG. 6D is about $2.3 \times 10^{19}$ atoms/cm$^3$, whereas the gallium concentration in FIG. 6A is about $2.9 \times 10^{18}$ atoms/cm$^3$ at this depth and the gallium concentration in FIG. 6B is about $4.8 \times 10^{18}$ atoms/cm$^3$.

Figure 7:
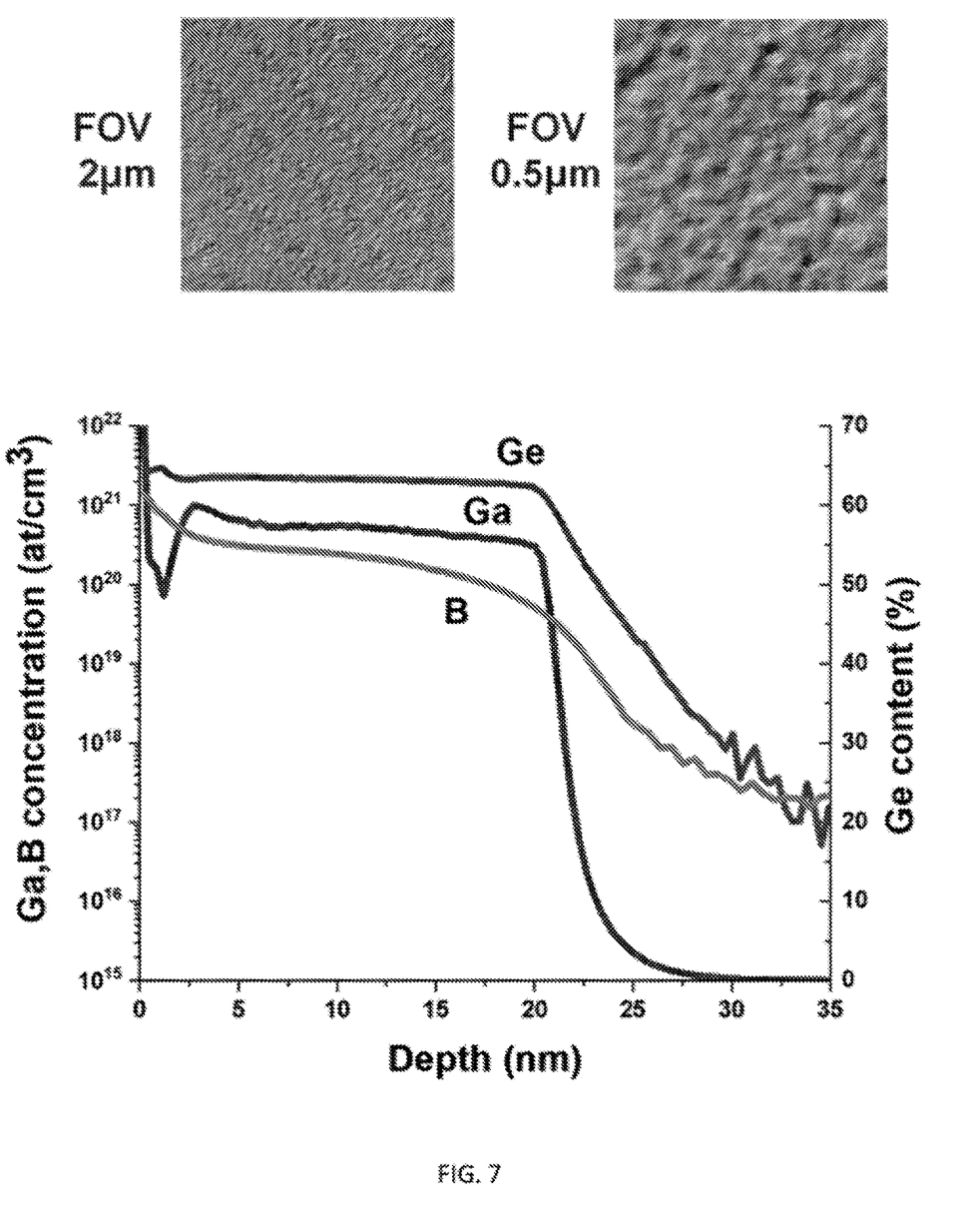
FIG. 7 shows SEM images and a SIMS profile of a doped silicon germanium layer formed using a combination of precursors at an example temperature.

FIG. 7 shows SEM images and a SIMS profile of a doped silicon germanium layer formed using a combination of precursors at an example temperature. The sample was grown in the manner described with reference to FIG. 5, but using a temperature of 330° C. and a flow rate of 10 sccm of TEGa and a flow rate of 350 sccm of TTBGa. The morphology of the resulting boron- and gallium-doped silicon germanium film was analyzed using SEM with a FOV of 2 microns (left panel) and 0.5 microns (right panel). No aggregated gallium was observed on the surface of the sample, and as such the sample was not etched. The layer thickness was measured to be 24.3 nm, the layer resistivity was measured to be 0.557 mOhm·cm, and the layer had a gallium concentration of about 39.7%. The SIMS profile of this sample, also shown in FIG. 7, shows a relatively high and relatively flat concentration of gallium through the thickness of the film, e.g., a gallium concentration of about $2.4 \times 10^{20}$ atoms/cm$^3$ at a depth of 10 nm, about $1.5 \times 10^{20}$ atoms/cm$^3$ at a depth of 15 nm, and about $5.2 \times 10^{19}$ atoms/cm$^3$ at a depth of 20 nm.

The example embodiments of the disclosure described above do not limit the scope of the invention, since these embodiments are merely examples of the embodiments of the invention, which is defined by the appended claims and their legal equivalents. Any equivalent embodiments are intended to be within the scope of this invention. Indeed, various modifications of the disclosure, in addition to those shown and described herein, such as alternative useful combinations of the elements described, may become apparent to those skilled in the art from the description. Such modifications and embodiments are also intended to fall within the scope of the appended claims.

What is claimed is:

1. A method of forming a doped silicon germanium layer, the method comprising:
    generating a heteroleptic gallium precursor using a first gallium precursor and a second gallium precursor, the first gallium precursor comprising at least one straight chain alkyl group, the second gallium precursor comprising at least one tertiary alkyl group, and the heteroleptic gallium precursor comprising (i) the at least one straight chain alkyl group in which a terminal carbon is directly bonded to gallium, and (ii) the at least one tertiary alkyl group in rich a tertiary carbon is directly bonded to the gallium, wherein the generating includes moving the at least one straight chain alkyl group from the first gallium precursor to the second gallium precursor or moving the at least one tertiary allyl group from the second gallium precursor to the first gallium precursor;
    simultaneously exposing a substrate to (a) a silicon precursor, (b), a germanium precursor, (c) a boron precursor, and (d) the heteroleptic gallium precursor; and
    reacting the silicon precursor, the germanium precursor, the boron precursor, and the heteroleptic gallium precursor to form, on the substrate, a silicon germanium layer that is doped with boron and gallium.

2. The method of claim 1, wherein the heteroleptic gallium precursor is generated in a gas above the substrate.

3. The method of claim 1, comprising flowing the first gallium precursor and the second gallium precursor over the substrate in a stoichiometric ratio of about 1:3 to about 3:1.

4. The method of claim 1, wherein the heteroleptic gallium precursor comprises at least one of $GaR^1_2R^2$ and $GaR^1R^2_2$, wherein $R^1$ is the straight chain alkyl group and wherein $R_2$ is the tertiary alkyl group.

5. The method of claim 1, wherein the heteroleptic gallium precursor comprises a mixture of $GaR^1_2R^2$ and $GaR^1R^2_2$ in a ratio of about 1:3 to about 3:1, wherein $R^1$ is the straight chain alkyl group and wherein $R^2$ is the tertiary alkyl group.

6. The method of claim 1, wherein the straight chain alkyl group is ethyl, n-propyl, n-butyl, or n-pentyl.

7. The method of claim 1, wherein the tertiary alkyl group is tert-ethyl, tert-propyl, tert-butyl, or tert-pentyl.

8. The method of claim 1, wherein the straight chain alkyl group is ethyl and the tertiary alkyl group is tert-butyl.

9. The method of claim 1, wherein the boron precursor comprises diborane ($B_2H_6$), deuterium-diborane ($B_2D_6$), or one or more borohydrides.

10. The method of claim 1, wherein the silicon precursor comprises silane ($SiH_4$), disilane ($Si_2H_6$), trisilane ($Si_3H_8$), tetrasilane ($Si_4H_{10}$), pentasilane ($Si_5H_{12}$), methylsilane ($CH_3 \cdot SiH_3$), dichlorosilane ($H_2SiCl_2$), or diiodosilane ($H_2SiI_2$).

11. The method of claim 1, wherein the germanium precursor comprises germane ($GeH_4$), digermane ($Ge_2H_6$), trigermane ($Ge_3H_8$), or germylsilane ($GeH_6Si$).

12. The method of claim 1, wherein the substrate is exposed to the silicon precursor, the germanium precursor, the boron precursor, and the heteroleptic gallium precursor at a temperature of about 150° C. to about 450° C.

13. The method of claim 1, wherein the silicon germanium layer comprises surface segregated gallium, the method further comprising removing the surface segregated gallium.

14. The method of claim 13, wherein the removing comprises a wet chemical etch.

15. The method of claim 1, wherein the silicon germanium layer has a thickness of about 8 nm to about 12 nm.

16. The method of claim 15, wherein the silicon germanium layer has a boron concentration of at least about $4.1 \times 10^{20}$ atoms/cm$^3$ at a depth of 20 nm.

17. A system for forming a doped silicon germanium layer, the system comprising:
    a reaction chamber configured to hold a substrate;
    respective sources of (a) a silicon precursor, (b), a germanium precursor, (c) a boron precursor, (d) a first gallium precursor comprising at least one straight chain alkyl group, and (e) a second gallium precursor comprising at least one tertiary alkyl group; and
    a controller configured to:
        cause the first gallium precursor and the second gallium precursor to flow above the substrate to generate a heteroleptic gallium precursor in a gas comprising (i) the at least one straight chain alkyl group in which a terminal carbon is directly bonded to gallium, and (ii) the at least one tertiary alkyl group in which a tertiary carbon is directly bonded to gallium; and
        cause the silicon precursor, the germanium precursor, and the boron precursor to flow with the heteroleptic gallium precursor over the substrate and there react to form, on the substrate, a silicon germanium layer that is doped with boron and gallium.

18. The system of claim 17, wherein the controller is configured to flow the first gallium precursor and the second gallium precursor over the substrate in a stoichiometric ratio of about 1:3 to about 3:1.

19. The system of claim 17, wherein the heteroleptic gallium precursor comprises at least one of $GaR^1_2R^2$ and $GaR^1R^2_2$, wherein $R^1$ is the straight chain alkyl group and wherein $R^2$ is the tertiary alkyl group.

20. The system of claim 17, wherein the reaction chamber is configured to expose the substrate to the silicon precursor, the germanium precursor, the boron precursor, and the heteroleptic gallium precursor at a temperature of about 150° C. to about 450° C.

* * * * *